(12) United States Patent
Zhang et al.

(10) Patent No.: US 11,578,400 B2
(45) Date of Patent: Feb. 14, 2023

(54) FINE METAL MASK HAVING PROTECTIVE PORTIONS HAVING PROTECTIVE PORTION WITH RATIO OF THICKNESS REDUCTION EQUAL TO SINGLE PIXEL APERTURE RATIO AND METHOD FOR MANUFACTURING THE SAME, MASK FRAME ASSEMBLY

(71) Applicant: BOE TECHNOLOGY GROUP CO., LTD., Beijing (CN)

(72) Inventors: Bin Zhang, Beijing (CN); Xinxing Wang, Beijing (CN); Tingting Zhou, Beijing (CN); Xuefei Sun, Beijing (CN); Weijie Wang, Beijing (CN); Haibin Zhu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 421 days.

(21) Appl. No.: 16/235,758

(22) Filed: Dec. 28, 2018

(65) Prior Publication Data

US 2019/0233931 A1 Aug. 1, 2019

(30) Foreign Application Priority Data

Jan. 31, 2018 (CN) .......................... 201810099588.9

(51) Int. Cl.
*C23C 14/04* (2006.01)
*B05D 1/32* (2006.01)
*C23C 16/04* (2006.01)
*H01L 51/56* (2006.01)
*H01L 51/00* (2006.01)
(Continued)

(52) U.S. Cl.
CPC ............ *C23C 14/042* (2013.01); *B05C 17/06* (2013.01); *B05C 21/005* (2013.01); *B05D 1/32* (2013.01); *C23C 16/042* (2013.01); *G03F 1/64* (2013.01); *H01L 21/308* (2013.01);
(Continued)

(58) Field of Classification Search
CPC ............................ C23C 14/042; C23C 16/042
See application file for complete search history.

(56) References Cited

U.S. PATENT DOCUMENTS 3,652,895 A * 3/1972 Tsuneta ................. H01J 29/076
313/403
10,196,732 B2 * 2/2019 Kwon ..................... H01L 51/00
(Continued)

FOREIGN PATENT DOCUMENTS

| CN | 102760842 A | 10/2012 |
| CN | 103855325 A | 6/2014 |
| CN | 106158697 A | 11/2016 |

OTHER PUBLICATIONS

First Office Action dated Jul. 3, 2019, issued in corresponding Chinese Patent Application No. 201810099588.9, with English translation.

*Primary Examiner* — Karl Kurple
(74) *Attorney, Agent, or Firm* — McDermott Will & Emery LLP

(57) ABSTRACT

The fine metal mask provided in the present disclosure includes at least one mask pattern portion, and at least one protective portion that is disposed on and connected with at least one side edge of the at least one mask pattern portion, wherein a thickness of the at least one protective portion is less than a thickness of the at least one mask pattern portion.

8 Claims, 6 Drawing Sheets

(51) Int. Cl.
  *B05C 21/00* (2006.01)
  *B05C 17/06* (2006.01)
  *H01L 21/308* (2006.01)
  *G03F 1/64* (2012.01)
  *H05K 3/12* (2006.01)
  *H01L 27/32* (2006.01)

(52) U.S. Cl.
  CPC .......... *H01L 51/0011* (2013.01); *H01L 51/56* (2013.01); *H05K 3/1225* (2013.01); *H01L 27/3211* (2013.01)

(56) References Cited

U.S. PATENT DOCUMENTS

| | | | |
|---|---|---|---|
| 2006/0012290 A1* | 1/2006 | Kang | H01L 27/3211 313/504 |
| 2007/0072337 A1* | 3/2007 | Matsuzaki | H01L 51/0011 438/99 |
| 2010/0055810 A1* | 3/2010 | Sung | C23C 16/042 438/22 |
| 2011/0168087 A1* | 7/2011 | Lee | C23C 14/12 118/504 |
| 2012/0266813 A1* | 10/2012 | Hong | B05C 21/005 118/505 |
| 2014/0150721 A1* | 6/2014 | Oh | H01L 51/0011 118/504 |
| 2015/0027367 A1* | 1/2015 | Hong | C23C 14/04 118/505 |
| 2016/0011504 A1* | 1/2016 | Wu | G03F 1/50 430/5 |

* cited by examiner

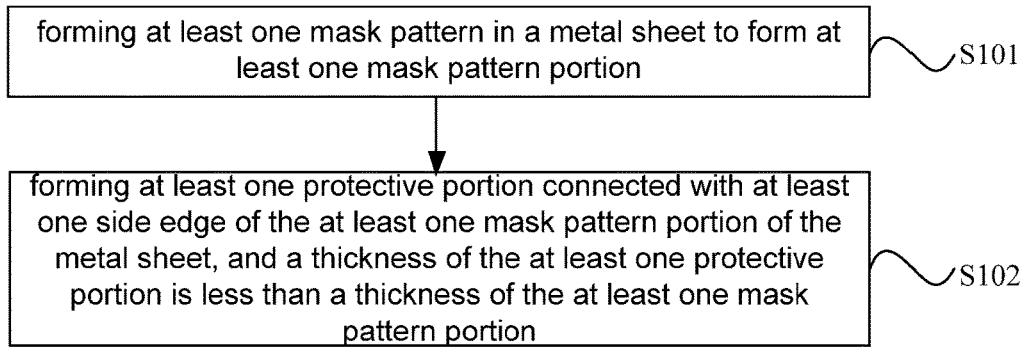
Fig. 9
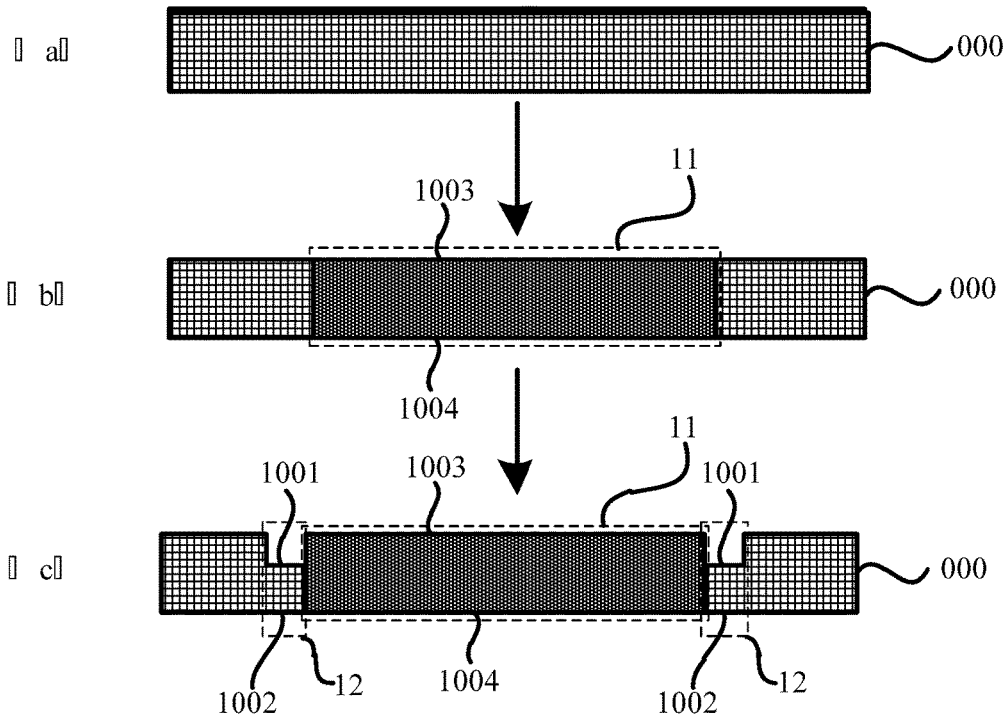
Fig. 10
forming a first protective layer, which covers a first portion, on the metal sheet, wherein the first portion is a portion of the metal sheet except a portion in which the at least one mask pattern is to be formed; forming at least one mask pattern in a portion which is not covered by the first protective layer; and removing the first protective layer ⌒ S1011
Fig. 11 forming a second protective layer, which covers a second portion, on the metal sheet, wherein the second portion is a portion of the metal sheet except a portion to be thinned; thinning the portion to be thinned, which is not covered by the second protective layer, from at least one side of the portion to be thinned; and removing the second protective layer ⸺ S1021

FINE METAL MASK HAVING PROTECTIVE PORTIONS HAVING PROTECTIVE PORTION WITH RATIO OF THICKNESS REDUCTION EQUAL TO SINGLE PIXEL APERTURE RATIO AND METHOD FOR MANUFACTURING THE SAME, MASK FRAME ASSEMBLY

CROSS-REFERENCE TO RELATED APPLICATION

This application claims priority to Chinese Patent Application No. 201810099588.9, filed with Chinese Patent Office on Jan. 31, 2018, and titled "A FINE METAL MASK AND METHOD FOR MANUFACTURING THE SAME, MASK FRAME ASSEMBLY", which is incorporated herein by reference in its entirety.

TECHNICAL FIELD

The present disclosure relates to the technical field of mask evaporation, and more particularly, to a fine metal mask and a method for manufacturing the same, and a mask frame assembly.

BACKGROUND

A display device includes a plurality of pixel units arranged in an array, and each pixel unit (referred briefly to as RGB sub-pixel units) includes sub-pixel units having three colors of red (R), green (G) and blue (B). Taking an organic light emitting diode (OLED) display device as an example, each sub-pixel unit of one pixel unit (e.g., red sub-pixel units, green sub-pixel units or blue sub-pixel units) specifically includes an anode layer, a hole transport layer, a light emitting layer (EML) capable of emitting red, green or blue light, an electron transport layer, and a cathode layer. At present, a red sub-pixel unit, a green sub-pixel unit and a blue sub-pixel unit in one pixel unit of the OLED display device are usually arranged through a side by side manner. A mask is used when sub-pixel units are manufactured. Sub-pixel units of two colors in pixel units are blocked by virtue of a blocking effect of blocking portions on the mask, and then film-forming materials are passed through a pattern portion of the mask and deposited on a sub-pixel unit corresponding to one unblocked color in a way of evaporation or inkjet printing, so that corresponding patterns are formed to be as body materials of the light emitting layers of the sub-pixel unit. Sub-pixel units of the other two colors in the pixel units are then exposed out sequentially, so as to be deposited to form films. Thus, the light emitting layers of the whole pixel units are manufactured.

As Pixels Per Inch (PPI, the quantity of pixels in per inch), which is one of important parameters of the display device, of a screen increase, the patterning portions on the mask need further refinement. In this case, a fine metal mask (FMM) is required.

SUMMARY

An aspect of some embodiments of the present disclosure provides a fine metal mask. The fine metal mask includes at least one mask pattern portion, and at least one protective portion disposed at and connected with at least one side edge of the at least one mask pattern portion, wherein a thickness of the at least one protective portion is less than a thickness of the at least one mask pattern portion.

In some embodiments, each of the at least one protective portion comprises a first surface and a second surface opposite to each other, each of the at least one mask pattern portion comprises a third surface and a fourth surface opposite to each other; the first surface and the third surface are at a side of a reference plane, and the first surface are closer to the reference plane than the third surface, wherein the reference plane is a plane which passes through an approximate center of thickness of each of the at least one mask pattern portion and is parallel to the third surface or the fourth surface; and/or the second surface and the fourth surface are at an opposite side of the reference plane, and the second surface is closer to the reference plane than the fourth surface.

In some embodiments, each of the at least one protective portion is obtained by thinning the fine metal mask from a surface of the fine metal mask to the first surface, or from an opposite surface of the fine metal mask to the second surface.

In some embodiments, each of the at least one protective portion is obtained by thinning the fine metal mask from a surface of the fine metal mask to the first surface and from an opposite side of the fine metal mask to the second surface.

In some embodiments, a maximum distance between the first surface and the third surface is equal to a maximum distance between the second surface and the fourth surface.

In some embodiments, a reduction in thickness of the fine metal mask from a surface of the fine metal mask to the first surface is equal to a reduction in thickness of the fine metal mask from an opposite surface of the fine metal mask to the second surface.

In some embodiments, a ratio of a reduction in thickness of the fine metal mask from the surface of the fine metal mask to the first surface to the thickness of the at least one mask pattern portion is 0.7-1.3 times a single pixel aperture ratio of one of the at least one mask pattern portion; or a ratio of a reduction in thickness of the fine metal mask from the opposite surface of the fine metal mask to the second surface to the thickness of the at least one mask pattern portion is 0.7-1.3 times a single pixel aperture ratio of one of the mask pattern portion.

In some embodiments, a ratio of a sum of reductions in thickness of the fine metal mask from the surface of the fine metal mask to the first surface and from the opposite surface of the fine metal mask to the second surface to the thickness of the at least one mask pattern portion is 0.7-1.3 times a single pixel aperture ratio of one of the at least one mask pattern portion.

In some embodiments, the ratio of the reduction in thickness of the fine metal mask from the surface of the fine metal mask to the first surface to the thickness of the at least one mask pattern portion is equal to the single pixel aperture ratio of the one of the at least one mask pattern portion; or the ratio of the reduction in thickness of the fine metal mask from the opposite surface of the fine metal mask to the second surface to the thickness of the at least one mask pattern portion is equal to the single pixel aperture ratio of the one of the mask pattern portion.

In some embodiments, the ratio of the sum of reductions in thickness of the fine metal mask from the surface of the fine metal mask to the first surface and from the opposite surface of the fine metal mask to the second surface to the thickness of the at least one mask pattern portion is equal to the single pixel aperture ratio of the one of the at least one mask pattern portion.

Another aspect of some embodiments in the present disclosure provides a mask frame assembly. The mask frame assembly includes a plurality of fine metal masks above mentioned, and a mask frame. The plurality of fine metal masks are fixed on the mask frame.

In some embodiments, the plurality of fine metal masks comprises a plurality of protective portions, and each protective portion is obtained by thinning a corresponding one of the plurality of fine metal masks from at least a side of the corresponding one of the plurality of fine metal masks close to the substrate on which a film to be formed.

In some embodiments, two ends of each of the plurality of fine metal masks along a first direction are fixed on the mask frame; the plurality of fine metal masks comprises a plurality of protective portions and a plurality of mask pattern portions, and two of the plurality of protective portions are respectively disposed at two side edges of a corresponding one of the plurality of mask pattern portions along a second direction, and the first direction is perpendicular to the second direction.

In some embodiments, some of the plurality of protective portions are disposed on side edges of at least one of the plurality of mask pattern portion along the first direction.

Yet another aspect of some embodiments in the present disclosure provides a method for manufacturing a fine metal mask, including: forming at least one mask pattern in a metal sheet to form at least one mask pattern portion; forming at least one protective portion connected with at least one side edge of the at least one mask pattern portion of the metal sheet, and a thickness of the at least one protective portion is less than a thickness of the at least one mask pattern portion.

In some embodiments, forming at least one mask pattern in the metal sheet to form the at least one mask pattern portions comprises: forming a first protective layer, which covers a first portion, on the metal sheet, wherein the first portion is a portion of the metal sheet except a portion in which the at least one mask pattern is to be formed; forming at least one mask pattern in a portion which is not covered by the first protective layer; and removing the first protective layer.

In some embodiments, forming at least one protective portion connected with at least one side edge of the at least one mask pattern portion of the metal sheet comprises: forming a second protective layer, which covers a second portion, on the metal sheet, wherein the second portion is a portion of the metal sheet except a portion to be thinned; thinning the portion to be thinned, which is not covered by the second protective layer, from at least one side of the portion to be thinned; and removing the second protective layer.

BRIEF DESCRIPTION OF THE DRAWINGS

The accompanying drawings described herein are used to provide further understanding of the present disclosure and constitute a part of the present disclosure. The exemplary embodiments in the present disclosure and the descriptions thereof serve to explain the present disclosure, but do not constitute an improper limitation to the present disclosure. In the accompanying drawings:

FIG. 9 is a flow chart of a method for manufacturing a fine metal mask according to some embodiments of the present disclosure;

FIG. 10 is a structural flow chart of the method illustrated in FIG. 9;

FIG. 11 is a flow chart of a method for manufacturing another fine metal mask according to some embodiments of the present disclosure;

DETAILED DESCRIPTION

The technical solutions in the embodiments of the present disclosure will be described clearly and completely with reference to the accompanying drawings in the embodiments of the present disclosure. Obviously, the described embodiments are merely some embodiments but not all of embodiments of the present disclosure. All other embodiments made on the basis of the embodiments of the present disclosure by a person of ordinary skill in the art without paying any creative effort shall be included in the protection scope of the present disclosure.

A fine metal mask includes a plurality of mask pattern portions, and the plurality of mask pattern portions include hollowed-out portions for transferring and printing patterns to be formed. In an evaporation process, to prevent wrinkles from being generated on the mask pattern portions to affect a good efficiency of film-formation, two stretched ends of a fine metal mask are usually welded to a frame, so as to manufacture a mask frame assembly (MFA) and attached this mask frame assembly on a surface of a substrate on which the film is to be formed. In this way, during evaporation, an evaporation material may penetrate the hollowed-out portions on the mask pattern portions of the fine metal masks and be deposited on the surface of the substrate on which the film is to be formed, so that films with patterns to be formed are formed on the substrate on which the film is to be formed.

As it is still unavoidable that wrinkles are generated on the fine metal masks in the stretched state, when the mask frame assembly is attached to the substrate on which the film is to be formed to evaporate in the evaporator, the wrinkles on the fine metal masks are concentrated in the mask pattern portions of the fine metal masks, and thereby easily resulting in deviation appearing in edges of patterns for forming films. When the fine metal mask is used to manufacture patterns of pixel units, intersection or stack is generated in boundaries of films for forming sub-pixel units of different colors due to the deviation of edges. As a result, a color mixing problem occurs among the sub-pixel units during displaying, which affects a display effect and loses a good efficiency of manufacture.

Figure 1:
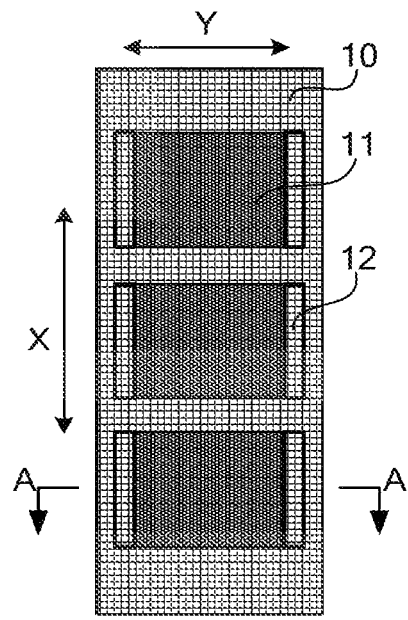
FIG. 1 is a schematic structural diagram of a fine metal mask according to some embodiments of the present disclosure.
Figure 2:
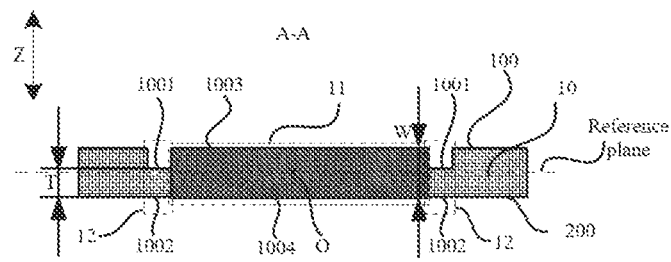
FIG. 2 is a sectional view taken along line A-A in FIG. 1.
Figure 4:
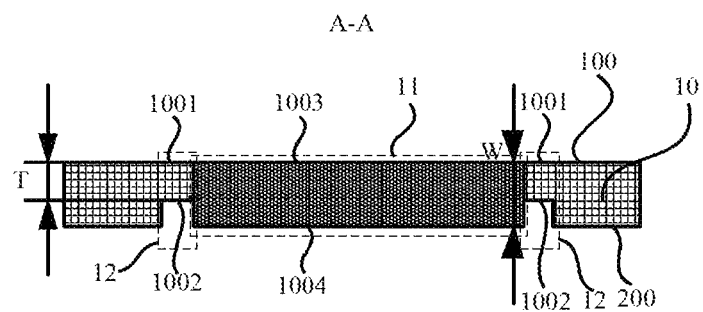
FIG. 4 is another sectional view taken along line A-A in FIG. 1.
Figure 6:
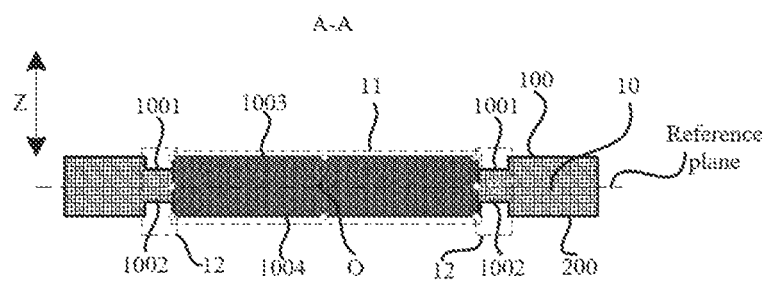
FIG. 6 is yet another sectional view taken along line A-A in FIG. 1.
Figure 7:
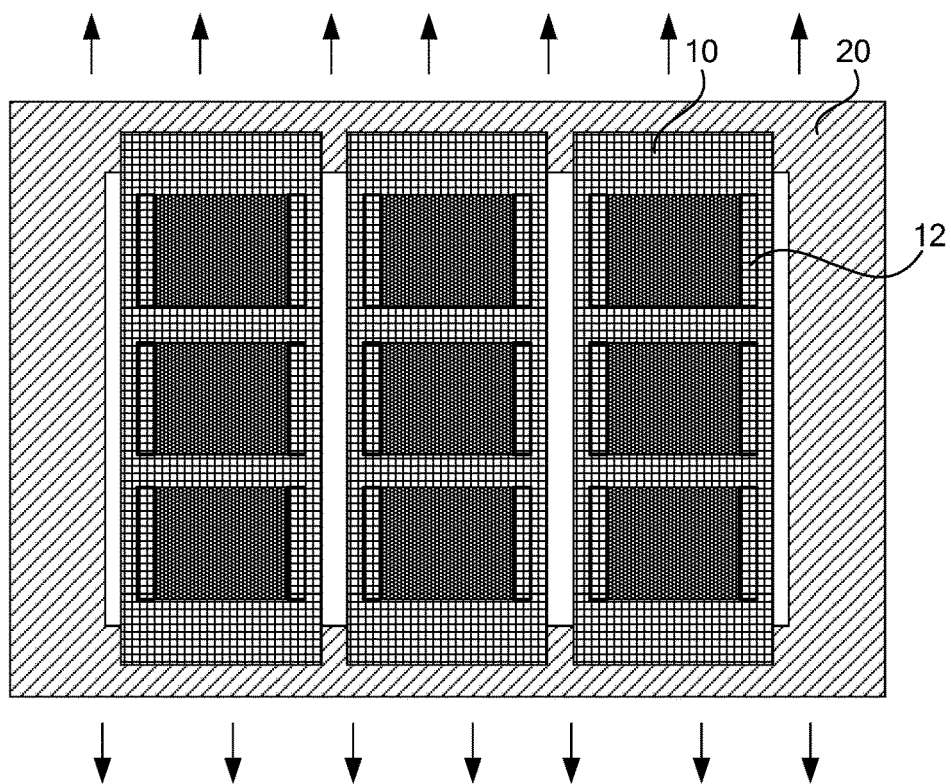
FIG. 7 is a schematic structural diagram of a mask frame assembly according to some embodiments of the present disclosure.
Figure 8:
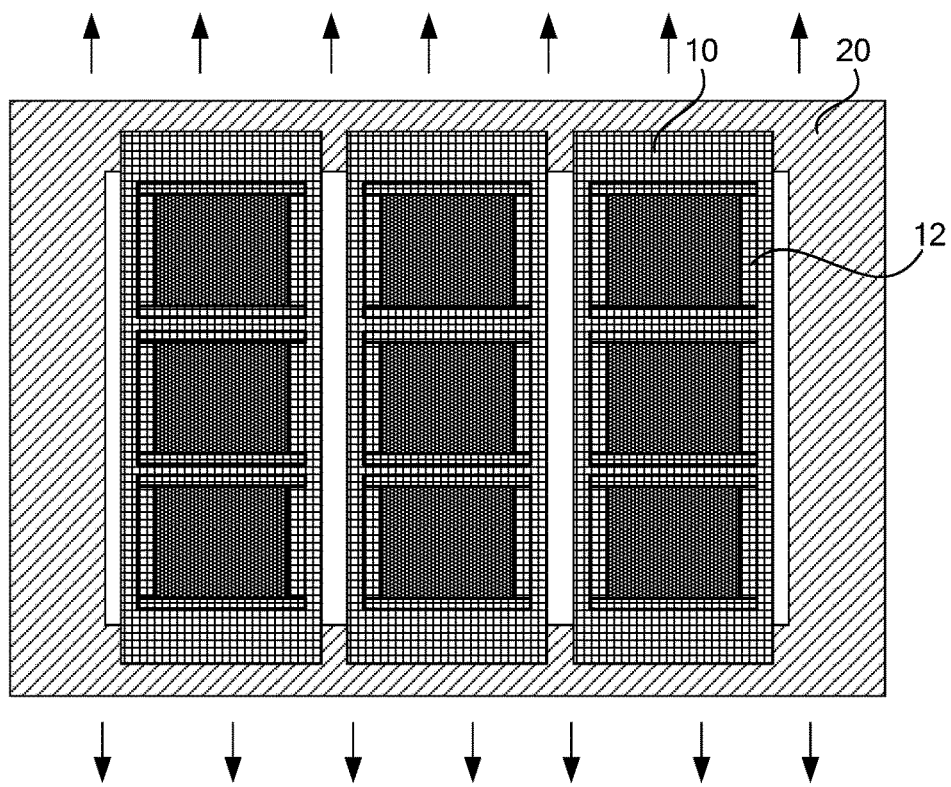
FIG. 8 is a schematic structural diagram of another mask frame assembly according to some embodiments of the present disclosure.

Some embodiments of the present disclosure provide a mask frame assembly. As shown in FIG. 7 or FIG. 8, the mask frame assembly includes a plurality of fine metal masks 10, and a mask frame 20. The plurality of fine metal masks 10 are fixed on the mask frame 20. As shown in FIG. 1, a fine metal mask 10 includes at least one mask pattern portion 11 and at least one protective portion 12. At least one protective portion 12 is disposed at and connected with at least one side edge of the at least one mask pattern portion 11. As shown in FIGS. 2, 4, and 6, a thicknesses T of the at least one protective portion 12 is less than a thicknesses W of the at least one mask pattern portion 11.

The at least one mask pattern portion 11 may include one mask pattern portion 11 or a plurality of mask pattern portions 11, which is not specifically limited here. Exemplarily, as shown in FIG. 1, at least one mask pattern portion 11 includes a plurality of mask pattern portions 11 arranged in parallel. When films are formed by evaporation, the mask pattern portions 11 are used to form the films having corresponding patterns on the substrate on which the film is to be formed When the at least one mask pattern portion 11 includes a plurality of mask pattern portions 11, protective portions 12 can be disposed at edges of some of the plurality of mask pattern portions 11, and the protective portion(s) 12 can also be disposed at one or more edges of each of the mask pattern portions 11, which is not specifically limited here. Exemplarily, as shown in FIG. 1, protective portions 12 are disposed on two side edges of each of the mask pattern portions 11.

When the protective portion(s) 12 is disposed on one or more side edges of each of the mask pattern portions 11, the protective portion(s) 12 can be disposed at one side edge of each of the mask pattern portions 11, or the protective portion(s) 12 can be disposed on two side edges of each of the mask pattern portions 11, or the protective portion(s) 12 can be disposed on four side edges of each of the mask pattern portions 11, which are not specifically limited here. Exemplarily, as shown in FIG. 1 or FIG. 7, protective portions 12 are disposed on two side edges of each of the mask pattern portions 11. Still exemplarily, as shown in FIG. 8, protective portions 12 are disposed on four side edges of each of the mask pattern portions 11.

Since a mask pattern portion 11 includes a removed portion for transferring and printing film-forming patterns, a material removing ratio of the mask pattern portion 11 is different from a material removing ratio of a portion of the fine metal mask 10 excluding the mask pattern portion 11 (the portion of the fine metal mask 10 excluding the mask pattern portion 11 is not disposed with a removed portion or other processing structures and no material is removed, and therefore it shall be considered that the material removing ratio of the portion of the fine metal mask 10 excluding the mask pattern portion 11 is 0). It is to be easily understood that, material removing ratio refers to a ratio of a volume of removed material from an object, such as one mask pattern portion 11 or one protective portion 12, to a volume of the material of the object before the removing process occurs. Therefore, when the fine metal mask 10 is stretched and two ends of the fine metal mask 10 along a stretching direction are fixed on the mask frame 20, wrinkles occurring in the mask pattern portion 11 will be hard to extend and transferred to be outside of the mask pattern portion 11. So, at least one protective portion 12 is disposed on and connected with at least one side edge of the mask pattern portion 11. Exemplarily, as shown in FIG. 1, protective portions 12 are disposed on both side edges of the mask pattern portion 11 along a direction perpendicular to the stretching direction. Thus, when the fine metal mask 10 is stretched, wrinkles are most likely to occur on the two side edges perpendicular to the stretching direction. As shown in FIG. 2, a thickness T of a protective portion 12 is less than a thickness W of the mask pattern portion, that is, the protective portion is thinned as a whole. As a result, in relative to other portions on the fine metal mask 10 where no material is removed, the material removing ratio of the protective portion 12 is close to the material removing ratio of the mask pattern portion 11. Consequently, wrinkles on the mask pattern portions 11 are transferred to the protective portions 12, which ensures a pattern accuracy of the mask pattern portions 11, improves an accuracy of film patterns at edges of evaporated films, and decreases a possibility of color mixing during displaying.

The material removing ratio mentioned in above embodiments, for example, for the mask pattern portion 11, it refers to a ratio of an amount of materials etched to form the removed portion of the mask pattern portion 11 to a total amount of materials of a whole mask pattern portion 11. For another example, for the protective portion 12, the material removing ratio refers to a ratio of an amount of materials removed through thinning or otherwise processes from a portion of the fine metal mask 10 which forms the protective portion 12 to a total amount of materials of the portion for forming the protective portion 12. For the fine metal mask 10 made of the same material, when material removing ratios of two connected portions are closer to each other, deformations of the two connected portions are closer to each other. When there is stress force in one of the two connected portions, for example, crack, wrinkle and so on resulted from the stress force is easily guided and transferred to the other one of the two connected portions.

For the fine metal mask and the mask frame assembly provided by embodiments of the present disclosure, the fine metal mask includes mask pattern portions, and further includes at least one protective portion that is disposed on and connected with at least one side edge of the mask pattern portions. A thickness of the protective portion is less than a thickness of the mask pattern portion. Thus, by disposing protective portions at the edges of the mask pattern portions, connecting the protective portions and the edges, and making the thickness of the protective portion less than the thickness of the mask pattern portion, the material removing ratio of the protective portion is closer to the material removing ratio of the mask pattern portion. And therefore the deformation of the protective portion is closer to the deformation of the mask pattern portion. Consequently, the wrinkles that still possibly generated through the fine metal mask under a tension state can be guided and transferred to the protective portions, so as to prevent the wrinkles from being concentrated in the mask pattern portions, to decrease a possibility of wrinkles in the mask pattern portions of the fine metal mask, to decrease the deviation that is possibly occurred at the edges of the film-forming patterns, and to decrease the possibility that colors of the formed films are mixed during displaying. Therefore, the display effect is improved.

In some embodiments of the present disclosure, each of the at least one protective portion 12 comprises a first surface 1001 and a second surface 1002 opposite to each other, each of the at least one mask pattern portion 11 comprises a third surface 1003 and a fourth surface 1004 opposite to each other. In the orientation illustrated in FIGS.2 and 6, in a vertical direction Z, the first surface 1001 is an upper surface of the protective portion 12, the second surface 1002 is a lower surface of the protective portion 12, the third surface 1003 is an upper surface of the mask pattern portion 11, and the fourth surface 1004 is a lower surface of the mask pattern portion 11. A reference plane (as shown by a dotted line of FIGS.2 and 6) is a plane which passes through an approximate center O of thickness of each of the at least one mask pattern portion 11 and is parallel to the third surface 1003 or the fourth surface 1004. The first surface 1001 and the third surface 1003 are at a side of the reference plane, and the first surface 1001 is closer to the reference plane than the third surface 1003, and/or the second surface 1002 and the fourth surface 1004 are at an opposite side of the reference plane, and the second surface 1002 is closer to the reference plane than the fourth surface 1004.

In order to the thickness T of the protective portion 12 is less than a thickness W of the mask pattern portion 11, the fine metal mask 10 may be formed through integral molding, additive material manufacturing or the like except thinning or other processing manner for reducing the amount of material.

Figure 3:
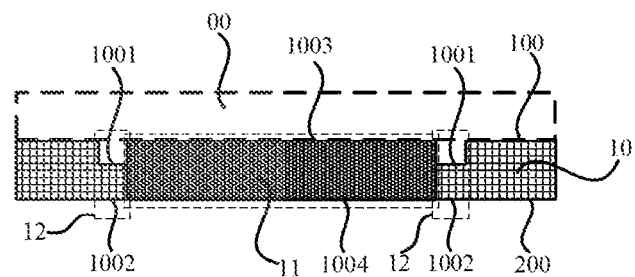
FIG. 3 is a schematic structural diagram of the fine metal mask illustrated in FIG. 2 assembled together with a substrate on which a film is to be formed.

In some embodiments, as shown in FIG. 2 or FIG. 3, the fine metal mask 10 includes a surface 100 and an opposite surface 200. The protective portion 12 is obtained by thinning the fine metal mask from the surface 100 to the first surface 1001, or from the opposite surface 200 to the second surface 1002, such that the material removing ratio of the protective portion 12 is closer to the material removing ratio of the mask pattern portion 11.

For example, as shown in FIG. 3, when the fine metal mask 10 is applied during a mask evaporation operation, a substrate 00 on which the film is to be formed is disposed on a side of the fine metal mask 10 facing away from the opposite surface 200, and a surface on which the film is to be formed of the substrate 00 is in close contact with the surface 100 of the fine metal mask 10. The evaporation material is located on a side of the fine metal mask 10 facing away from the surface 100. The evaporation material is vaporized by heating or other manners and deposited on the surface of the substrate 00 which receives the film through the removed portions of the mask pattern portions 11 in the fine metal mask 10. A thinning operation is performed on a portion of the surface 100 (i.e., a surface closer to the substrate 00 which receives the film) of the fine metal mask 10 closer to the mask pattern portion 11, so that the materials of this portion are partially removed to form the protective portion 12. As a result, the material removing ratio of the protective portion 12 is approximately equal to the material removing ratio of the mask pattern portion 11. Moreover, overall thinning manner, a fabrication error of which is smaller, simplifies the process and is easily operated. And overall thinning manner is less likely to damage peripheral circuits and so on, which disposed on the substrate on which the film is to be formed and are opposite to the protective portions 12 of the fine metal mask 10.

Figure 5:
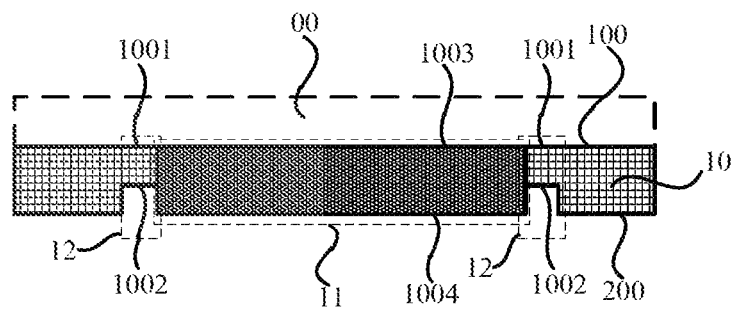
FIG. 5 is a schematic structural diagram of the fine metal mask illustrated in FIG. 4 assembling together with the substrate on which the film is to be formed.

For another example, as shown in FIGS. 4 and 5, a thinning operation is performed from a portion of the opposite surface 200 (i.e., a surface facing away from the substrate 00 on which the film is to be formed) of the fine metal mask 10 closer to mask pattern portion 11, so that the material of this portion can be partially removed to form the protective portion 12. Such that the material removing ratio of the protective portion 12 is closer to that of the mask pattern portion 11 in cases of simplifying an operation process and not affecting other structures on the substrate 00 on which the film is to be formed.

In some other embodiments, as shown in FIG. 6, the fine metal mask 10 includes the surface 100 and the opposite surface 200, and the protective portions 12 are obtained by thinning the fine metal mask 10 from the surface 100 to the first surface 1001 and from the opposite surface 200 to the second surface 1002. Thus, when a plurality of fine metal masks 10 are stretched and fixed to the mask frame 20 (as shown in FIGS.7 and 8) to form the mask frame assembly, due to thinning from these two surfaces to obtain the protective portion 12, if the thinning operation is performed from either of the two surfaces, curls of the fine metal mask 10 towards one surface, from which the thinning operation is performed, are avoided during stretching the fine metal mask 10. And therefore, a non-flatness of the fine metal mask 10 is avoided.

In some embodiments, as shown in FIG. 6, a maximum distance between the first surface 1001 and the third surface 1003 of the protective portion 12 is equal to a maximum distance between the second surface 1002 and the fourth surface 1004 of the mask pattern portion 11. As shown in FIG. 6, a reduction in thickness of the fine metal mask from the surface 100 of the fine metal mask 10 to the first surface 1001 of protective portion 12 is equal to a reduction in thickness of the fine metal mask from the opposite surface 200 of the fine metal mask to the second surface 1002 of protective portion 12. Thus, when the fine metal mask 10 is stretched, two forces, which are produced on both surfaces of the protective portion 12 and cause the protective portion 12 to curl, are balanced therebetween, and thereby decreasing the possibility that the protective portion 12 curls toward either of the two surface of the fine metal mask 10, and improving the flatness of the fine metal mask 10.

In some embodiments, when a ratio of a reduction in thickness of the fine metal mask from the surface of the fine metal mask to the first surface 1001 to the thickness of the at least one mask pattern portion is 0.7-1.3 times a single pixel aperture ratio of one of the at least one mask pattern portion; or a ratio of a reduction in thickness of the fine metal mask from the opposite surface of the fine metal mask to the second surface 1002 to the thickness of the at least one mask pattern portion is 0.7-1.3 times a single pixel aperture ratio of one of the mask pattern portion. a ratio of a sum of reductions in thickness of the fine metal mask from the surface of the fine metal mask to the first surface 1001 and from the opposite surface of the fine metal mask to the second surface 1002 to the thickness of the at least one mask pattern portion is 0.7-1.3 times a single pixel aperture ratio of one of the at least one mask pattern portion.

It is to be understood that, the mask pattern portion 11 is usually a single pixel portion. The single pixel aperture ratio of the mask pattern portion 11 refers to a ratio of an area of removed portion of the mask pattern portion 11 to a total area of the entire mask pattern portion 11, i.e., the material removing ratio described above. When the thickness of the protective portion 12 is equal to that of the mask pattern portion 11, the protective portion 12 can be regarded that the material removing ratio is zero, which needs to be thinned to obtain the protective portion. For example, when a ratio of the reduction in thickness of the fine metal mask 10 from the surface 100 of the fine metal mask to the first surface 1001 of the protective portion 12 to the thickness of the mask pattern portion 11 is equal to the single pixel aperture ratio of the mask pattern portion 11, the material removing ratio of the protective portion 12 can be regarded the same as that of the mask pattern portion 11. As the closer the material removing ratios of the protective portion 12 and the mask pattern portion 11 are, the closer their deformation are, such that the wrinkles generated by the mask pattern portion 11 are more easily guided to the protective portion 12. Therefore, a ratio of the reduction in thickness of the fine metal mask 10 to the thickness of the mask pattern portion 11 is set and controlled within ±30% of the single pixel aperture ratio of the mask pattern portion 11.

In some embodiments, when the ratio of the reduction in thickness of the fine metal mask from the surface of the fine metal mask to the first surface 1001 to the thickness of the at least one mask pattern portion is equal to the single pixel aperture ratio of the one of the at least one mask pattern portion; or the ratio of the reduction in thickness of the fine metal mask from the opposite surface of the fine metal mask to the second surface 1002 to the thickness of the at least one mask pattern portion is equal to the single pixel aperture ratio of the one of the mask pattern portion. And when the ratio of the sum of reductions in thickness of the fine metal mask from the surface of the fine metal mask to the first surface 1001 and from the opposite surface of the fine metal mask to the second surface 1002 to the thickness of the at least one mask pattern portion is equal to the single pixel aperture ratio of the one of the at least one mask pattern portion. Thus, the protective portion 12 and the mask pattern portion 11 have the same deformation, which can be regarded or approximately regarded to be made of the same material. When wrinkles occur on one of the protective portion 12 and the mask pattern portion 11, the wrinkles can be naturally transferred therebetween, thereby enabling the wrinkles on the mask pattern portion 11 to be transferred to the protective portion 12. And therefore, it avoids that the patterns accuracy at the edge of evaporated films is influenced due to the wrinkles remaining on the mask pattern portions 11.

In some embodiments, as shown in FIG. 7 or FIG. 8, the plurality of fine metal masks 10 are arranged and stretched in a same direction, and fixed on the mask frame 20, which forms the mask frame assembly. The plurality of fine metal masks 10 are in parallel or approximately parallel with each other.

In the above embodiments, there is an unavoidable gap between two adjacent fine metal masks 10. During the evaporation operation, the evaporation material is easily deposited through the gap onto a position of the substrate on which the film is to be formed where no film to be deposited. At the same time, since the fine metal mask 10 is only fixed on the mask frame 20 through two ends of the fine metal mask 10, the middle portion of the fine metal mask 10 is prone to bend downwards due to gravity. As a result, a deformation of the mask frame assembly during evaporation may affect the accuracy of the pattern of the evaporated film. Therefore, in some embodiments, support members may also be disposed on the mask frame 20. The support members may be arranged in a same direction as the arrangement direction of the fine metal mask 10, or may be arranged in perpendicular to the arrangement direction of the fine metal mask 10. It is not specifically limited in the embodiments of the present disclosure that whether and how to dispose the support members. And however, it needs to be assured that positions where the support members are overlapped with the fine metal mask 10 are not overlapped with the mask pattern portions 11 of the fine metal mask 10 when the support members are disposed on the mask frame assembly, so that the evaporation material is not hindered in the evaporation operation from forming films through the mask pattern portion 11 on the substrate on which the film is to be formed.

In some embodiments, as shown in FIG. 3, the fine metal mask 10 comprises a plurality of protective portions 12, and each protective portion 12 is obtained by thinning the fine metal mask 10 from at least a side of the fine metal mask closer to the substrate on which the film is to be formed.

It is to be understood that, in general, when the fine metal masks 10 are used for a film-forming mask operation in an evaporation device, one side of the mask frame assembly, at which the fine metal masks 10 are fixed to the mask frame 20, faces towards the substrate 00 on which the film is to be formed, and the other side of the mask frame assembly faces towards an evaporation source. Therefore, exemplarily, as shown in FIG. 3, the substrate 00 on which the film is to be formed is arranged on the surface 100 side of the fine metal mask 10 facing away from the surface 200, and the surface on which the film is to be formed of the substrate 00 is close contact with the surface 100 of the fine metal mask 10. The evaporation material is on the side of the fine metal mask 10 facing away from the surface 100. The evaporation materials are vaporized by heating or other means and deposited on the surface on which the film is to be formed of the substrate 00, through the removed portions of the mask pattern portions 11 in the fine metal masks 10. The thinning operation is performed from the surfaces 100 (i.e. at a side closer to a substrate 00 on which the film is to be formed) of the fine metal masks 10, so that the materials of the surfaces 100 are partially removed to form the protective portion 12. In this manner, on one hand, the material removing ratio of the protective portion 12 is closer to the material removing ratio of the mask pattern portion 11; on the other hand, overall thinning manner, a fabrication error of which is smaller, simplifies the process and is easily operated. Moreover, portions of the substrate 00 on which the film is to be formed that are opposite to the protective portions 12 are usually provided with peripheral circuits and so on which are precisely arranged, such that through thinning process, gaps are formed between the thinned protective portions 12 and the peripheral circuits opposite to the protective portions 12. Therefore, the protective portions 12 are prevented from directly contacting with the peripheral circuits and other structures. Thus, it is less likely to cause damages on the peripheral circuits and other structures. In some embodiments, as shown in FIG. 1 and FIG. 7, two ends of the fine metal mask 10 along the first direction (i.e., a direction X in FIG. 1) are fixed on the mask frame 20, and the protective portions 12 are disposed on two side edges of the mask pattern portion 11 along the second direction (i.e., a direction Y in FIG. 1) perpendicular to the first direction. Thus, when the fine metal masks 10 are fixed to the mask frame 20 to form a mask frame assembly and stretched along the direction (i.e., the first direction) shown by an arrow in FIG. 7, two side edges of the mask pattern portion 11 along the second direction perpendicular to the first direction are more prone to form wrinkles due to stress forces. Therefore, protective portions 12 are arranged on the two side edges of the mask pattern portion 11 along the second direction perpendicular to the first direction. Thus, in the production of the mask frame assembly in embodiments of the present disclosure, when the fine metal masks 10 are stretched along the first direction and are fixed to the mask frame 20, wrinkles will occur in the second direction on the fine metal masks. At this time, the wrinkles occurring in the mask pattern portions 11 can be transferred to the protective portions 12 which have closer deformation therebetween, thereby preventing the wrinkles from affecting the accuracy of the patterns at the edges of the mask pattern portions 11. Thus, when the mask frame assembly in embodiments of the present disclosure is used in the mask evaporation, the accuracy of the films formed on the substrate on which the film is to be formed can be ensured. Exemplarily, when the RGB sub-pixel units to be formed on the OLED display panel are sequentially evaporated through the mask frame assembly in embodiments of the present disclosure in a mask evaporation manner, since the patterns at the edges of the mask pattern portions 11 are not prone to be affected by factors such as wrinkles produced by stress forces, and so on, thus patterns of the RGB sub-pixel units formed on the OLED display panel have accurate positions, which is less likely to cause display problems like color mixing of the finished OLED display panel.

The two ends of the fine metal mask 10 along the first direction can be fixed to the mask frame 20 by welding, affixing, snap-fitting or hooking etc., which is not specifically limited here.

In some embodiments, as shown in FIG. 8, protective portions 12 are further disposed on two side edges of the mask pattern portion 11 along the first direction (i.e., the direction X in FIG. 1). Thus, protective portions 12 are disposed at the four side edges of the mask pattern portion 11. Exemplarily, as shown in FIG. 8, four protective portions 12 are connected in a head-to-end manner to form a ring shape around the side edges of the mask pattern portion 11. Thus, wrinkles occurring on any side of the mask pattern portion 11 can be transferred to a corresponding protective portion 12, which prevents the wrinkles from affecting formations of the films at the side edges of the mask pattern portion 11.

In the above description of the fine metal mask 10 in the embodiments of the present disclosure, the working process of the mask frame assembly including the fine metal mask 10 in the evaporation operation has been described in detail and will not be repeated here.

Some embodiments of the present disclosure further provide a method for manufacturing a fine metal mask, as shown in FIGS. 9 and 10, including following S101 to S102.

S101, forming at least one mask pattern in a metal sheet 000 referring to (a) of FIG. 10 to form at least one mask pattern portion, referring to (b) of FIG. 10.

S102, referring to (c) of FIG. 10, forming at least one protective portion 12 connected with at least one side edge of the at least one mask pattern portion 11 of the metal sheet 000, and a thickness of the at least one protective portion 12 is less than a thickness of the at least one mask pattern portion 11.

Forming the fine metal mask 10 in embodiments of the present disclosure includes two parts which are for forming at least one mask pattern portion 11 and at least one protective portion 12 on the metal sheet respectively. It is to be understood that in embodiments of the present disclosure, there is no specific limitation to a sequential order of forming the mask pattern portions 11 (i.e., S101) and the protective portions 12 (S102). The mask pattern portions 11 can be firstly forming on the metal sheet, and then the protective portions 12 are formed on the edge(s) of the mask pattern portion 11, i.e., S101 is firstly performed, and then S102 is performed. Alternatively, the protective portions 12 can be firstly formed on the metal sheet, i.e., the protective portions 12 are formed on at least one side edge of preset positions of the mask pattern portions 11, and then the mask pattern portions 11 are formed on the preset positions on the metal sheet with the protective portions 12 having been formed.

Exemplarily, the following specific description is implemented through taking an example that S101 is performed firstly and then S102 is performed. As shown in FIG. 9, at least one mask pattern is firstly formed on the metal sheet to form at least one mask pattern portion 11. Those skilled in the art may set a reasonable number and locations of mask pattern portions 11 on the fine metal mask 10 according to actual needs. And then the protective portions 12 are formed to be connected with at least one side edge of the mask pattern portions 11, and the thickness of the at least one protective portion is less than the thickness of the at least one mask pattern portion, such that the mask frame assembly in embodiments of the present disclosure is formed.

Figures 12, 13:
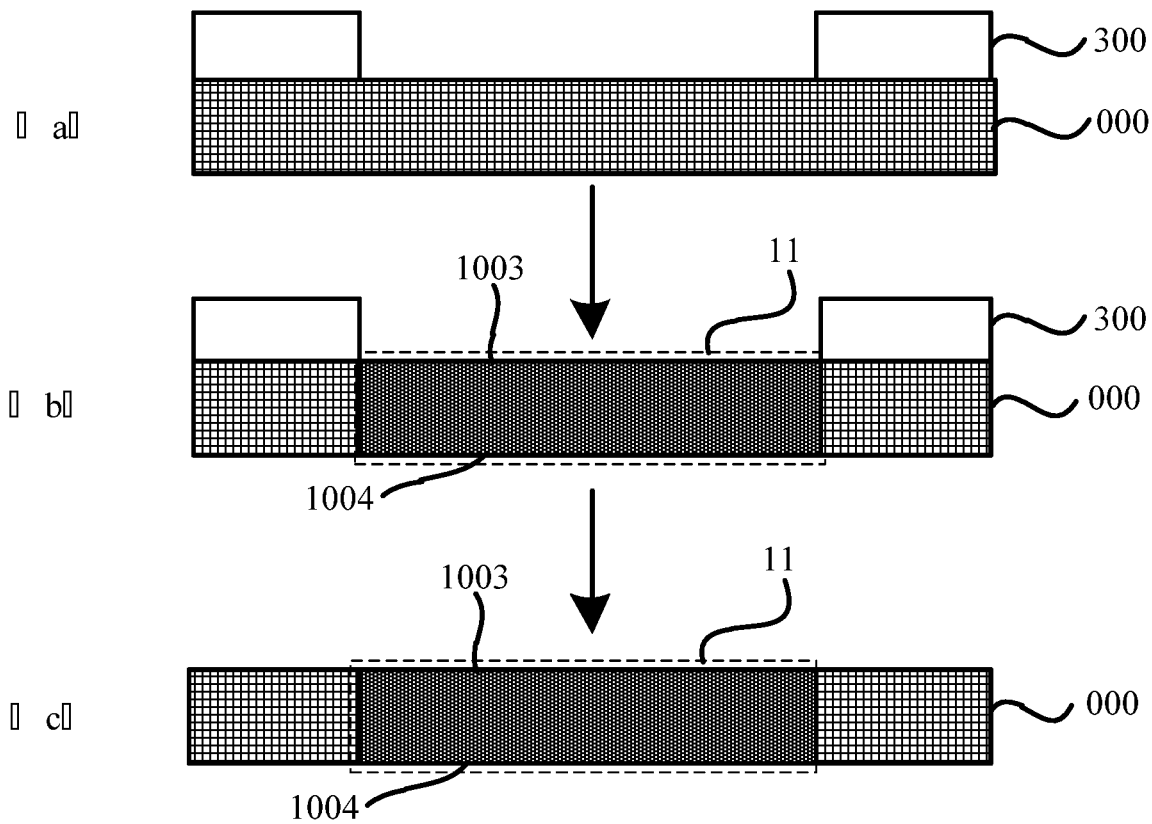
FIG. 12 is a structural flow chart of the method illustrated in FIG. 11.
FIG. 13 is a flow chart of a method for manufacturing yet another fine metal mask according to some embodiments of the present disclosure.

In some embodiments, as shown in FIGS. 11 and 12, in S101, forming at least one mask pattern on the metal sheet to form at least one mask pattern portion 11 includes S1011.

S1011, referring to (a) of FIG. 12, forming a first protective layer 300, which covers a first portion, on the metal sheet 000, wherein the first portion is a portion of the metal sheet except a portion in which the at least one mask pattern is to be formed; referring to (b) of FIG. 12 forming at least one mask pattern 11 in a portion which is not covered by the first protective layer 300, referring to (c) of FIG. 12; and removing the first protective layer 300. In this way, other portions on the metal sheet 000 excluding the portion where mask patterns are to be arranged can be protected by the protective layers 300. Thus, when the mask pattern portions 11 are forming, e.g. when the mask pattern portions 11 are formed by wet etching, an etching liquid will be prevented from etching materials of this portion.

Figure 14:
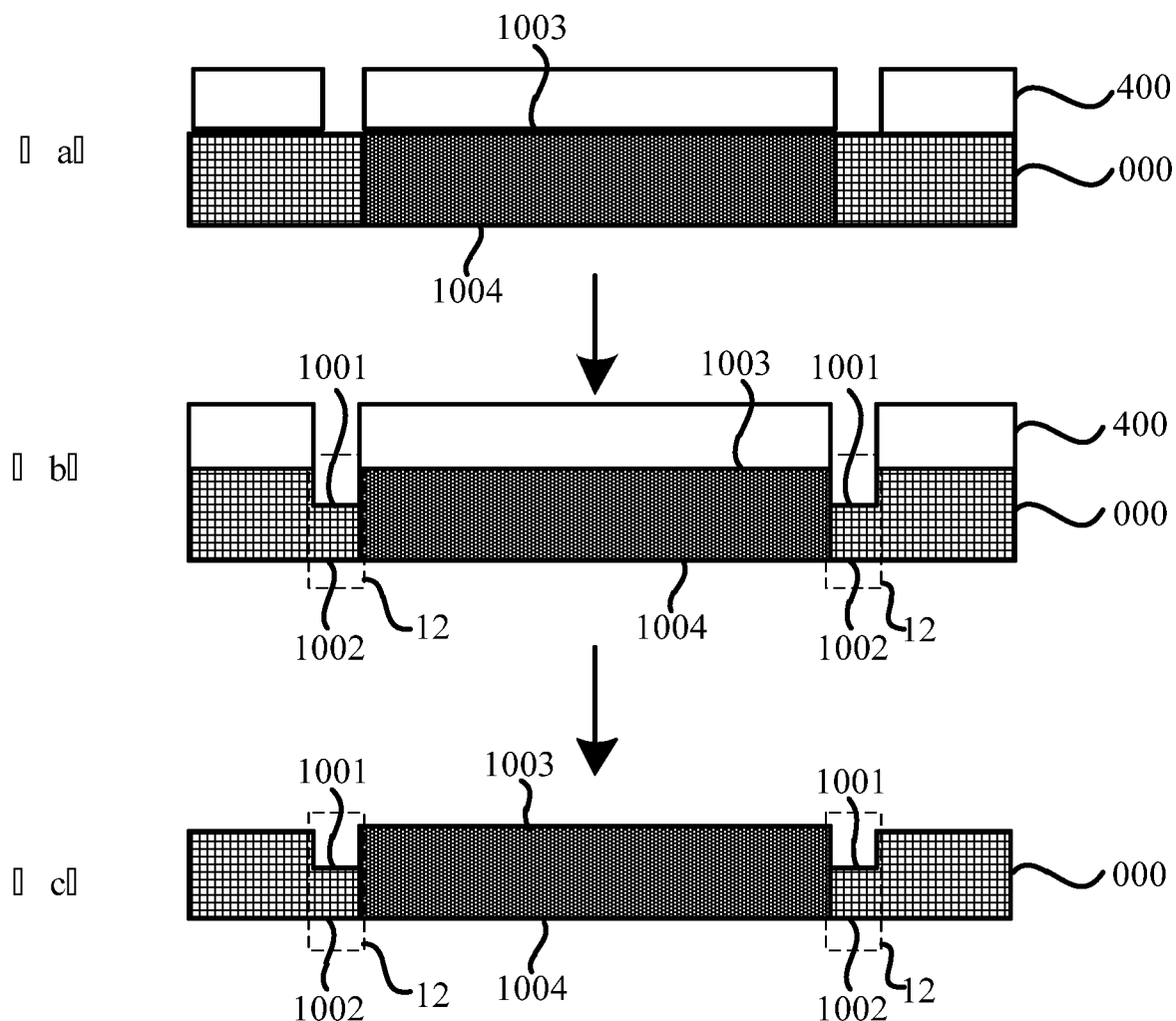
FIG. 14 is a structural flow chart of the method illustrated in FIG. 13.

In some embodiments, as shown in FIGS. 13 and 14, in S102, forming at least one protective portion connected with at least one side edge of the at least one mask pattern portion of the metal sheet, and a thickness of the at least one protective portion is less than a thickness of the at least one mask pattern portion includes S1021.

S1021, referring to (a) of FIG. 14, forming a second protective layer 400, which covers a second portion, on the metal sheet 000, wherein the second portion is a portion of the metal sheet 000 except a portion to be thinned, thinning the portion to be thinned, which is not covered by the second protective layer 400, from at least one side of the portion to be thinned, referring to (b) of FIG. 14; and removing the second protective layer 400 referring to (c) of FIG. 14. Thus, when the mask pattern portions 12 are formed, materials at this portion will not be affected.

In the description of the above embodiments, specific features, structures, materials or characteristics can be combined with an appropriate manner in any one or more embodiments or samples.

The above embodiments are merely some implementation manner of the present disclosure, but the protection scope of the present disclosure is not limited thereto, and the changes or replacements that any person skilled in the art can easily think of in the technical scope disclosed by the present disclosure should be within the protection scope of the present disclosure. Therefore, the protection scope of the present disclosure shall be subject to the protection scope of the claims.

What is claimed is:

1. A fine metal mask, comprising:
  at least one mask pattern portion; and
  at least one protective portion disposed at and connected with at least one side edge of the at least one mask pattern portion, wherein a thickness of the at least one protective portion is less than a thickness of the at least one mask pattern portion, and the thickness of the at least one mask pattern portion is equal to a thickness of the fine metal mask; wherein:

each of the at least one protective portion is obtained by thinning the fine metal mask from two opposite surfaces of the fine metal mask;

a ratio of a reduction in thickness of the at least one protective portion to the thickness of the at least one mask pattern portion is equal to a single pixel aperture ratio of one of the mask pattern portion; wherein the single pixel aperture ratio refers to a ratio of an area of removed portion of one of the mask pattern portion to a total area of a corresponding entire mask pattern portion, each mask pattern portion is a single pixel portion, and the removed portion is formed by removing material from each mask pattern portion;

each of the at least one protective portion comprises a first surface and a second surface opposite to each other; the fine metal mask comprise a surface and an opposite surface; each of the at least one protective portion is obtained by thinning the fine metal mask from the surface of the fine metal mask to the first surface and from the opposite surface of the fine metal mask to the second surface; a reduction in thickness of the fine metal mask from the surface of the fine metal mask to the first surface is equal to a reduction in thickness of the fine metal mask from the opposite surface of the fine metal mask to the second surface;

each of the at least one mask pattern portion comprises a third surface and a fourth surface opposite to each other;

the first surface and the third surface are at a side of a reference plane, and the first surface is closer to the reference plane than the third surface is close to the reference plane in a vertical direction, wherein the reference plane is a plane which passes through an approximate center of thickness of each of the at least one mask pattern portion and is parallel to the third surface or the fourth surface; the second surface and the fourth surface are at an opposite side of the reference plane, and the second surface is closer to the reference plane than the fourth surface is close to the reference plane in the vertical direction; and the at least one protective portion includes four protective portions, four side edges of each of the at least one mask pattern portion are each provided with one of the four protective portions, the four protective portions are connected in a head-to-end manner to form a shape extending around and surrounding the four side edges of each of the at least one mask pattern portion.

2. A mask frame assembly, comprising:
a plurality of fine metal masks according to claim 1; and
a mask frame, wherein, the plurality of fine metal masks are fixed on the mask frame.

3. The mask frame assembly according to claim 2, wherein the plurality of fine metal masks comprises a plurality of protective portions, and each protective portion is obtained by thinning a corresponding one of the plurality of fine metal masks from two opposite sides of the corresponding one of the plurality of fine metal masks closer to the substrate on which a film to be formed.

4. The mask frame assembly according to claim 2, wherein two ends of each of the plurality of fine metal masks along a first direction are fixed on the mask frame;

the plurality of fine metal masks comprises a plurality of protective portions and a plurality of mask pattern portions, and two of the plurality of protective portions are respectively disposed on two side edges of a corresponding one of the plurality of mask pattern portions along a second direction, and the first direction is perpendicular to the second direction.

5. The mask frame assembly according to claim 4, wherein two of the plurality of protective portions are disposed on two side edges of at least one of the plurality of mask pattern portion along the first direction, respectively.

6. A method for manufacturing the fine metal mask comprising: at least one mask pattern portion; and at least one protective portion disposed at and connected with at least one side edge of the at least one mask pattern portion, wherein a thickness of the at least one protective portion is less than a thickness of the at least one mask pattern portion, and the thickness of the at least one mask pattern portion is equal to a thickness of the fine metal mask, the method comprising:

forming at least one mask pattern in a metal sheet to form the at least one mask pattern portion;

forming the at least one protective portion connected with the at least one side edge of the at least one mask pattern portion of the metal sheet; wherein each of the at least one protective portion is obtained by thinning the fine metal mask from two opposite surfaces of the fine metal mask;

a ratio of a reduction in thickness of the at least one protective portion to the thickness of the at least one mask pattern portion is equal to a single pixel aperture ratio of one of the mask pattern portion; wherein the single pixel aperture ratio refers to a ratio of an area of removed portion of one of the mask pattern portion to a total area of a corresponding entire mask pattern portion, each mask pattern portion is a single pixel portion, and the removed portion is formed by removing material from each mask pattern portion;

each of the at least one protective portion comprises a first surface and a second surface opposite to each other; the fine metal mask comprise a surface and an opposite surface; each of the at least one protective portion is obtained by thinning the fine metal mask from the surface of the fine metal mask to the first surface and from the opposite surface of the fine metal mask to the second surface; a reduction in thickness of the fine metal mask from the surface of the fine metal mask to the first surface is equal to a reduction in thickness of the fine metal mask from the opposite surface of the fine metal mask to the second surface;

each of the at least one mask pattern portion comprises a third surface and a fourth surface opposite to each other;

the first surface and the third surface are at a side of a reference plane, and the first surface is closer to the reference plane than the third surface is close to the reference plane in a vertical direction, wherein the reference plane is a plane which passes through an approximate center of thickness of each of the at least one mask pattern portion and is parallel to the third surface or the fourth surface; the second surface and the fourth surface are at an opposite side of the reference plane, and the second surface is closer to the reference plane than the fourth surface is close to the reference plane in the vertical direction; and the at least one protective portion includes four protective portions, four side edges of each of the at least one mask pattern portion are each provided with one of the four protective portions, the four protective portions are connected in a head-to-end manner to form a shape extending around and surrounding the four side edges of each of the at least one mask pattern portion.

7. The method for manufacturing the fine metal mask according to claim 6, wherein forming at least one mask pattern in the metal sheet to form the at least one mask pattern portions comprises:

forming a first protective layer, which covers a first portion, on the metal sheet, wherein the first portion is a portion of the metal sheet except a portion in which the at least one mask pattern is to be formed;

forming at least one mask pattern in a portion which is not covered by the first protective layer; and removing the first protective layer.

8. The method for manufacturing the fine metal mask according to claim 7, wherein forming at least one protective portion connected with at least one side edge of the at least one mask pattern portion of the metal sheet comprises:

forming a second protective layer, which covers a second portion, on the metal sheet, wherein the second portion is a portion of the metal sheet except a portion to be thinned;

thinning the portion to be thinned, which is not covered by the second protective layer, from at least one side of the portion to be thinned; and removing the second protective layer.

\* \* \* \* \*